(12) United States Patent
Farjadrad

(10) Patent No.: US 11,983,139 B2
(45) Date of Patent: *May 14, 2024

(54) MULTI-CHIP MODULE WITH INTEGRATED CIRCUIT CHIP HAVING POWER-EFFICIENT HYBRID CIRCUITRY

(71) Applicant: Marvell Asia Pte, Ltd., Santa Clara, CA (US)

(72) Inventor: Ramin Farjadrad, Los Altos, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/992,738

(22) Filed: Nov. 22, 2022

(65) Prior Publication Data
US 2023/0077591 A1    Mar. 16, 2023

Related U.S. Application Data

(63) Continuation of application No. 17/397,115, filed on Aug. 9, 2021, now Pat. No. 11,507,529, which is a continuation of application No. 16/365,510, filed on Mar. 26, 2019, now Pat. No. 11,088,876, which is a continuation-in-part of application No. 15/364,030, filed on Nov. 29, 2016, now Pat. No. 10,572,416.

(60) Provisional application No. 62/341,871, filed on May 26, 2016, provisional application No. 62/314,237, filed on Mar. 28, 2016.

(51) Int. Cl.
G06F 13/36 (2006.01)
G06F 13/40 (2006.01)
G06F 13/42 (2006.01)

(52) U.S. Cl.
CPC ...... *G06F 13/4282* (2013.01); *G06F 13/4068* (2013.01)

(58) Field of Classification Search
CPC .... H04B 10/40; H04B 10/541; H04B 10/801; H04J 14/02; H04L 25/03057
USPC .......................................................... 710/110
See application file for complete search history.

(56) References Cited

U.S. PATENT DOCUMENTS

| | | | |
|---|---|---|---|
| 6,621,155 B1 * | 9/2003 | Perino | H01L 25/0657 257/691 |
| 6,836,144 B1 * | 12/2004 | Bui | G11C 29/022 327/170 |
| 7,205,788 B1 * | 4/2007 | Wang | H04L 25/0278 333/32 |
| RE43,720 E * | 10/2012 | Perino | H01L 24/50 174/541 |

(Continued)

*Primary Examiner* — Titus Wong

(57) ABSTRACT

A multi-chip module (MCM includes a substrate and first and second integrated circuit chips disposed on the substrate. The second IC chip includes transceiver circuitry configured to communicate with the first IC chip. The transceiver circuitry includes transmit circuitry having an inverter circuit to generate a first signal for transmission to the first IC chip along a signaling link. The signaling link includes a line termination impedance. Receiver circuitry includes a receiver circuit to receive a second signal from the first IC chip along the signaling link concurrently with transmission of the first signal along the signaling link. Hybrid circuitry is coupled to the transmit circuitry and to the receiver circuitry. The hybrid circuitry is configured to cancel a received component of the first signal. The hybrid circuitry includes a replica termination impedance that is configured in an open state.

25 Claims, 13 Drawing Sheets

(56) References Cited

U.S. PATENT DOCUMENTS

| | | | | |
|---|---|---|---|---|
| 8,638,838 B1* | 1/2014 | Betts | ................ | H04L 7/033 |
| | | | | 375/295 |
| 2003/0062921 A1* | 4/2003 | Johnson | ............ | H04L 25/0292 |
| | | | | 326/30 |
| 2004/0100309 A1* | 5/2004 | Best | .............. | H03K 19/018585 |
| | | | | 327/65 |
| 2006/0244480 A1* | 11/2006 | Chan | .................. | H04L 25/0298 |
| | | | | 326/30 |
| 2007/0290712 A1* | 12/2007 | Gomez | ............ | H03K 19/0175 |
| | | | | 326/30 |
| 2010/0048043 A1* | 2/2010 | Morlion | ................ | H05K 1/114 |
| | | | | 439/78 |
| 2015/0319768 A1* | 11/2015 | Abdelmonem | ..... | H04W 72/541 |
| | | | | 455/501 |

* cited by examiner

MULTI-CHIP MODULE WITH INTEGRATED CIRCUIT CHIP HAVING POWER-EFFICIENT HYBRID CIRCUITRY

CROSS-REFERENCE TO RELATED APPLICATIONS

This application is a Continuation of U.S. patent application Ser. No. 17/397,115, filed Aug. 9, 2021, entitled MULTI-CHIP MODULE WITH CONFIGURABLE MULTI-MODE SERIAL LINK INTERFACES, which is a Continuation of U.S. patent application Ser. No. 16/365,510, filed Mar. 26, 2019, entitled MULTI-CHIP MODULE WITH CONFIGURABLE MULTI-MODE SERIAL LINK INTERFACES, which is a Continuation-in-Part of U.S. patent application Ser. No. 15/364,030, filed Nov. 29, 2016, entitled EFFICIENT SIGNALING SCHEME FOR HIGH-SPEED VSR LINKS, now U.S. Pat. No. 10,572,416, which claims priority to U.S. Provisional Application No. 62/314,237, filed Mar. 28, 2016, entitled EFFICIENT SIGNALING SCHEME FOR HIGH-SPEED VSR LINKS, and U.S. Provisional Application No. 62/341,871, filed May 26, 2016, entitled EFFICIENT SIGNALING SCHEME FOR HIGH-SPEED ULTRA SHORT REACH INTERFACES, all of which are incorporated herein by reference in their entirety.

TECHNICAL FIELD

The disclosure herein relates to communications systems, and more specifically to high-speed multi-chip signaling systems and methods.

BACKGROUND

Integrated circuit chip designers continually integrate more and more features and functions into single integrated circuit chips. Integrating into such small scale often provides scale-related advantages and performance, which is why SoC (system on chip) approaches garner widespread interest. However, very large chips with too many integrated functions often lead to yield and cost disadvantages. Because the defect density of a semiconductor fabrication process is generally fixed per unit area, chip yield often drops exponentially (not linearly) with an increase in area. One alternative to integrating all functions and features into a single large chip is to spread the functions and features out among multiple smaller chips, and package the chips together into a single integrated circuit package.

While conventionally employing multiple chips into a single package works well for its intended applications, there are often instances where the multiple chips need to communicate amongst themselves at very high data rates. Enabling such high-throughput communication among any two or more chips in the same package (or module) in a power efficient and cost efficient manner would be highly desirable.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of apparatus and methods for efficient signaling for ultra short reach (USR) links are disclosed. In one embodiment, a master integrated circuit (IC) chip is disclosed that includes transmit circuitry and receiver circuitry. The transmit circuitry includes a timing signal generation circuit to generate a first timing signal, and a driver to transmit first data in response to the first timing signal. A timing signal path routes the first timing signal in a source synchronous manner with the first data. The receiver circuitry includes a receiver to receive second data from a slave IC chip, and sampling circuitry to sample the second data in response to a second timing signal that is derived from the first timing signal.

In a further embodiment, a multi-chip module is disclosed that includes multiple Ethernet ports, each port formed on a dedicated integrated circuit (IC) chip and including Ethernet transceiver circuitry forming a line side of an Ethernet channel. The multi-chip module includes a serial interface end that is configured for connecting to less than all of the IC chips. Each chip includes an on-chip transfer interface operable to transfer data to an adjacent IC chip. The IC chips are configured to transfer data between the multiple Ethernet ports and the serial interface. In this manner, multi-chip modules may be used in data transfers between a defined number of Ethernet ports, and a reduced-in-number set of serial links.

Figure 1:
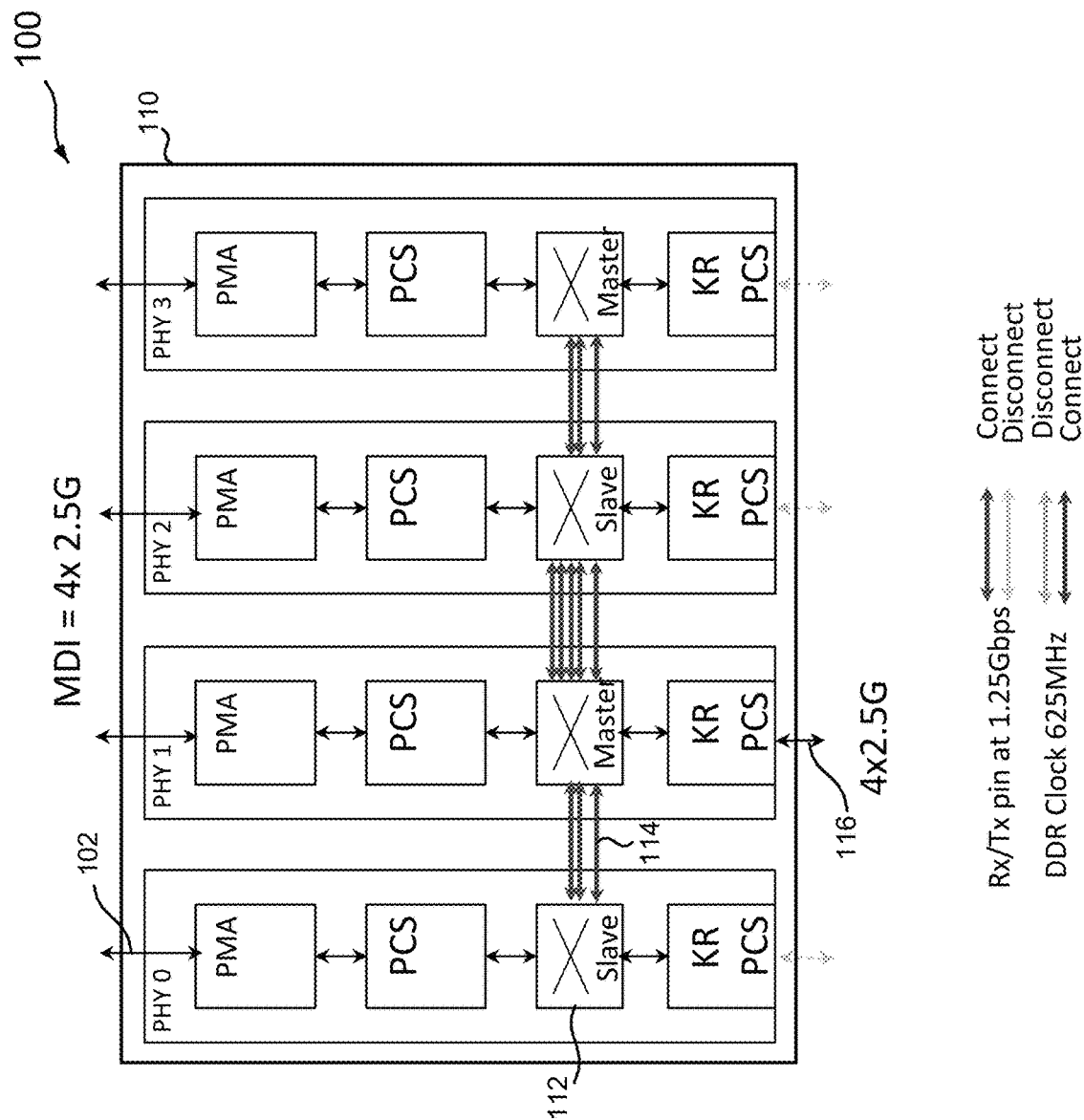
FIG. 1 illustrates one embodiment of a multi-chip module (MCM) for a quad-PHY Ethernet transceiver circuit.

FIG. 1 illustrates one embodiment of a multi-chip module (MCM) architecture, generally designated 100. Multiple integrated circuit (IC) chips PHY 0, PHY 1, PHY 2 and PHY 3 are disposed on a package substrate 110 to form an IC package. Each IC chip represents a high-speed Ethernet transceiver, often referred to as a "PHY."

Further referring to FIG. 1, each PHY includes signal conditioning circuitry PMA, such as crosstalk cancellers, echo cancellers, adaptive filters, and so forth that may be employed consistent with high-speed Ethernet standards, including for example 10GBASE-T and NBASE-T. The PMA forms one end of an Ethernet channel or port, such as at 102, for connection to an Ethernet medium, such as twisted pair copper cable. For one embodiment, each Ethernet channel transceives data at up to a 2.5 Gbps data rate, for an aggregate data rate of 10 Gbps. The signal conditioning circuitry PMA couples to a physical coding sublayer PCS that performs a variety of Ethernet-based coding functions.

Further referring to FIG. 1, each IC chip includes an off-chip data transfer interface 112 that efficiently transfers and/or receives data from one or more adjacent IC chips for data aggregation purposes. As explained in further detail with respect to FIG. 2, each transfer interface includes plural bidirectional source synchronous links, such as at 114, to route data and an accompanying timing signal, such as a double-data rate (DDR) clock, from one chip to an adjacent chip. In some circumstances, a given transfer interface may act as a repeater to pass data to a chip that originates from a non-adjacent chip. Using the middle chips, such as PHY1 and PHY2, as signal repeaters eliminates the need to route those signal through the package/module layers and under the middle chips where routability is very limited and adding routing layers is fairly costly. Ultra-sub-micron chips with very high routing density can easily provide many repeater channels at very low cost. The timing of a digital data bus that passes through a middle chip can be conserved to be the same as the source chip or alternatively resynchronized to the middle chip clock domain before passing to the following chip.

With continued reference to FIG. 1, each IC chip also includes a serial interface port labeled as KR/PCS that is selectively enabled based on the module configuration. One specific embodiment utilizes a USXGMII port for each chip. For the embodiment of FIG. 1, only the serial interface for PHY 1 has been enabled, at 116. Consequently, for the specific configuration shown, all data transferred to and from the MDI link end, which has the four Ethernet ports 102, is done so through the one enabled serial link port KR/PCS associated with PHY 1, at 116.

Figure 2:
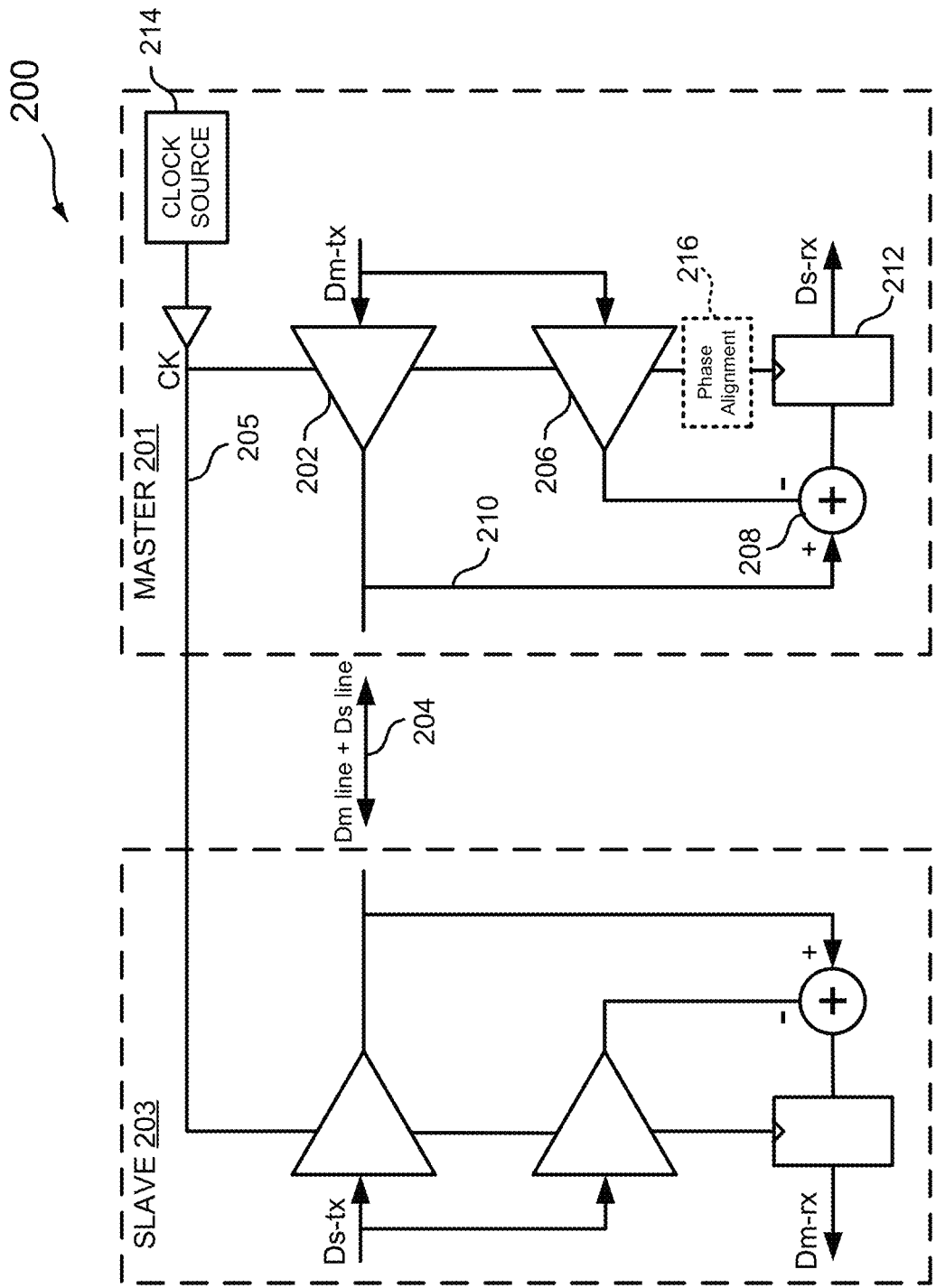
FIG. 2 illustrates one embodiment of a bidirectional single-ended signaling link for use in the multi-chip module of FIG. 1.

FIG. 2 illustrates one embodiment of a bidirectional signaling link, generally designated 200, for transferring and receiving data between adjacent transfer interface circuits, such as those identified in FIG. 1 at 112. For purposes of clarity, a single-ended link is shown, but the principles described may apply equally to a differential link. For some embodiments, eight such links may be connected to a given transfer interface for each chip (four links to one chip, four links to another). One end of the link may be configured as a master integrated circuit (IC) chip 201 "MASTER", while the other end may be configured as a slave IC chip 205 "SLAVE." The master IC chip generates and supplies a timing signal such as a clock signal CK along a clock path 205 to synchronize the transfer and receipt of data via the link in a source synchronous fashion.

As noted above, transmit and receive operations on the slave IC chip 203 are timed by the timing signal generated by the master IC chip 201. This enables the slave IC chip to function without the need for it to generate its own clock for transmit and receive operations, thereby reducing circuit complexity. The master and slave allocation can be designed to be programmable so the chip can operate properly in different multi-chip configurations. For one embodiment, the clock signal is a double data rate (DDR) clock at a frequency of 625 MHZ. The clock frequency is generated off of a 1.25 GHz source to ensure a 50% clock duty cycle. For very high signaling rates where the package trace lengths need to be treated like transmission lines, the bidirectional transceiver on either end of the link should provide a proper termination impedance to the package trace to eliminate or minimize signal reflections. To reduce power, the package/module traces are configured with an appropriately high characteristic impedance.

Further referring to FIG. 2, the master end of the link will be described in further detail, with the understanding that the slave end is formed similarly. Each end of the link includes a main driver 202 to transmit a data signal along a link 204. For one embodiment, the data transfer rate may be set up to 1.25 Gbps, but other rates are possible depending on the application. A replica driver 206 generates a replica data signal for supplying to a summing circuit 208. The summing circuit also receives a received data signal from receive path 210 that is received over the link 204. Since the link is simultaneously bidirectional, transmit and receive signals may be superposed on each other. The summing circuit 208 subtracts the transmit signal from the received signal so that the received data can be properly sampled by a sampler 212.

The timing for the drivers 202 and 206, and the sampler 212 is based on the master clock CK that is generated by a suitable clock source 214. The master clock is distributed to each of the drivers 202, 206, the sampler 212 and the slave IC chip 203 to achieve synchronization. For one embodiment, a round trip propagation delay in the master clock signal received from the slave IC chip may be compensated for by providing a phase alignment circuit 216 (shown in phantom) at the input of the sampler timing port. In one embodiment, the phase alignment circuit takes the form of a clock vernier. Other circuits may also be utilized for the phase alignment, such as a phase interpolator, a programmable delay line and so forth. The slave end of the link is formed similar to the master end, but utilizes the master clock signal for synchronization purposes, thereby freeing the slave IC chip from the overhead and complexity associated with the timing circuitry residing in the master IC chip 201. The slave end may also benefit from phase alignment at its receiver to improve sampling timing margins.

In operation, the MCM 100 of FIG. 1 is configured with four Ethernet ports 102 at the line end, and a single serial link port 116 opposite the line end. From a data receive perspective at the line end, the MCM of FIG. 1 receives data from the four Ethernet ports PHY 0-PHY 3 at a data rate of 2.5 Gbps for each port, and directs the data and aggregates it for transfer along the serial port 116 enabled for PHY1, at a 10 Gbps data rate.

Further referring to FIG. 1, the 2.5 Gbps data received by PHY 0 is transferred along two of the single-ended links 114 provided by the transfer interface (shown in FIG. 2) to the transfer interface of PHY 1, with each link operating at, for example, 1.25 Gbps. A link also provides a 625 MHz DDR clock for source synchronous timing synchronization. The transfer interface for PHY 1 includes four additional I/O ports that connect to four more links that are connected to PHY 2. Two of the links transfer the 2.5 Gbps data received by the Ethernet port of PHY 2, while the other two links provide 2.5 Gbps data transferred from PHY 3 to PHY 2 (along two transfer interface links between PHY 2 and PHY 3). PHY 2 thus acts as a repeater for the data being transferred from PHY 3. When aggregated at PHY 1, the data may be serialized in an acceptable manner to achieve a 10 Gbps data transfer rate at the serial interface KR/PCS, at 116.

Figure 3:
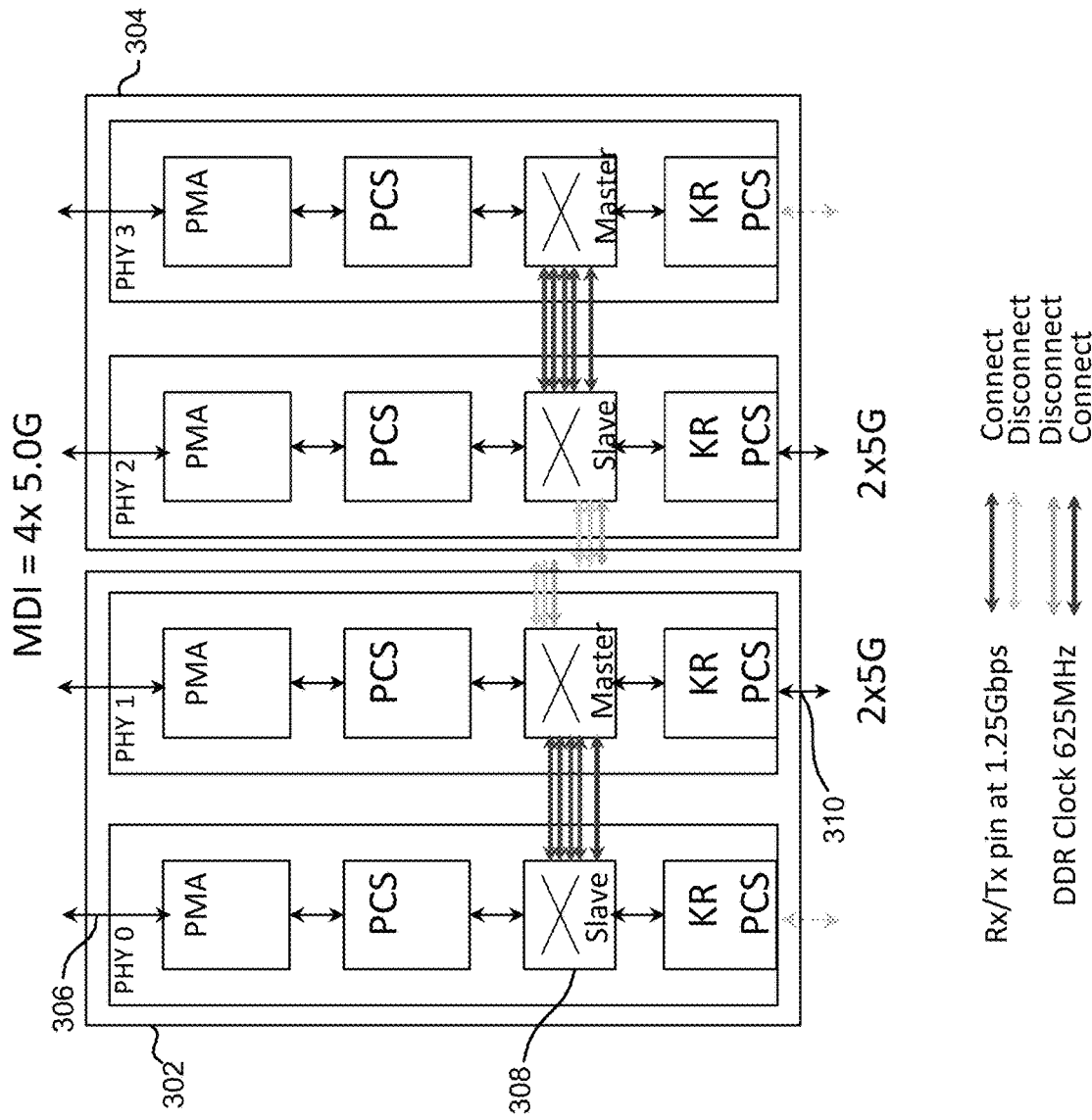
FIG. 3 illustrates a further embodiment of two multi-chip modules for two dual-PHY Ethernet transceiver circuits.

FIG. 3 illustrates an embodiment of two dual port multi-chip modules (MCM), 302 and 304. Each MCM includes a pair of Ethernet transceiver chips disposed on a package substrate, such as PHY 0, PHY 1 and PHY 2, PHY 3. Each chip includes an Ethernet port 306 for connecting to an Ethernet cable and transceiving data at a rate of, for example, 5 Gbps. Respective transfer interface circuits 308 are disposed on each chip to transfer data between the pair of chips for each module. Serial interface circuitry 310 on each chip is selectively enabled such that, for example, only one serial interface port is utilized for each MCM 302 and 304 to transfer data at 10 Gbps. The transfer interface 308 allows for an aggregation/disaggregation of data between the two Ethernet ports and a single serial link, similar to the 4:1 aggregation ratio described with the MCM architecture of FIG. 1. Needless to say, the four ports in FIG. 3 can all be bundled in a single multi-chip module (on the same substrate), while all connections stay the same as shown.

Figure 4:
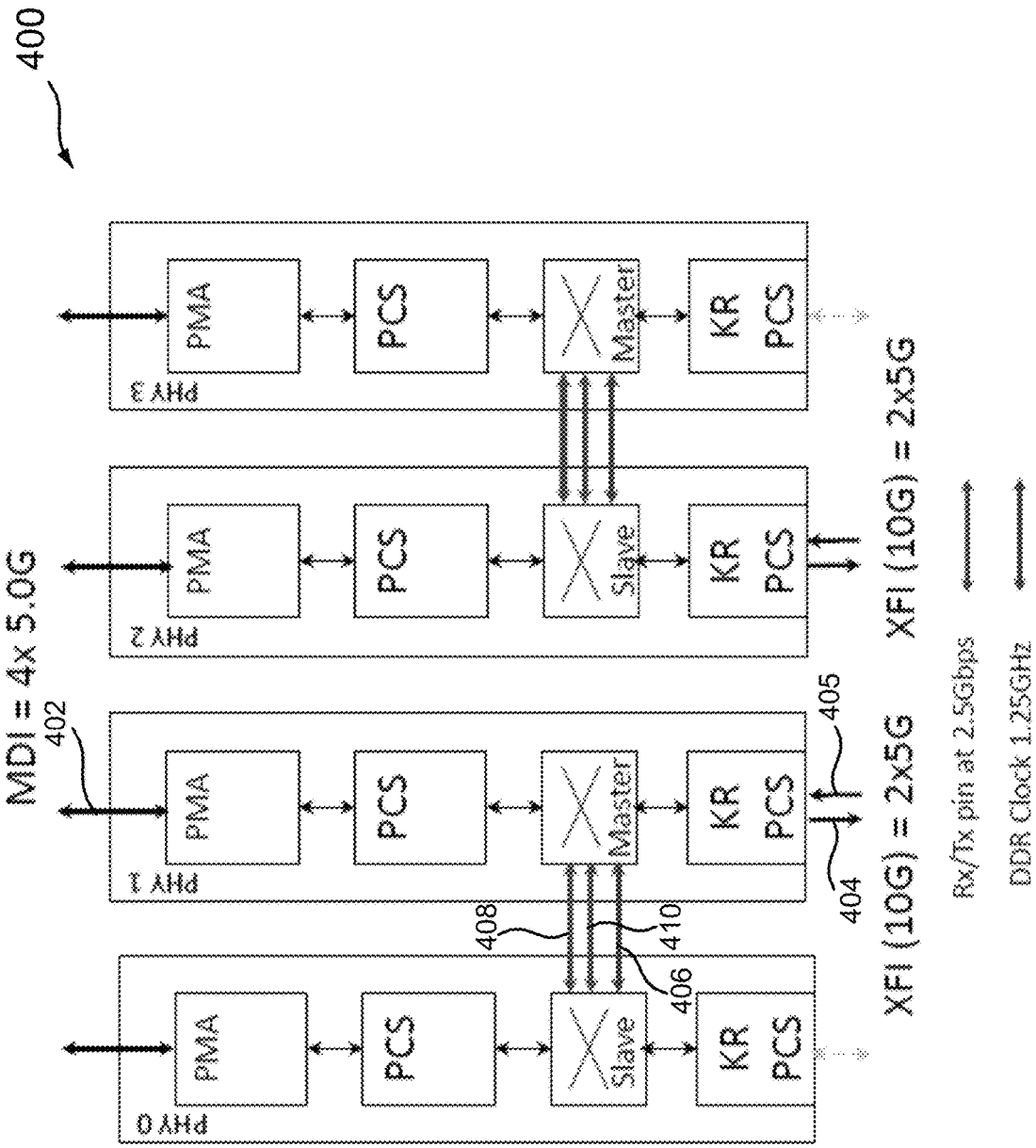
FIG. 4 illustrates an additional embodiment of a quad multi-chip module with a dual XFI interface.

One embodiment of a quad MCM that implements a dual SerDes interface is shown in FIG. 4, generally designated 400. The MCM includes four Ethernet transceiver chips PHY0, PHY1, PHY2, and PHY3 that are mounted on a common package substrate (not shown). The chips each include an Ethernet port, such as at 402, and a serial port, such as at 404. For one embodiment, the Ethernet ports each transceive data at 5 Gbps. As more fully explained below, less than all of the serial ports are enabled. To steer data and aggregate data for fewer (but faster) serial ports, each chip includes one clock pin, such as at 406, and two bi-directional single-ended data pins, such as at 408 and 410. For one embodiment, each data pin transmits and receives data at 2.5 Gbps, while the clock pin carries a double-data rate (DDR) clock at a frequency of 1.25 GHz. A slave PHY, such as PHY0, uses the clock associated with a master PHY, such as PHY1, to receive data from the master PHY and transmit data back to the master PHY. For one embodiment, the master and slave designations are hard-coded. Aggregated data may be transferred serially over enabled serial ports 404 and 405 at, for example, 10 Gbps.

Figure 5A:
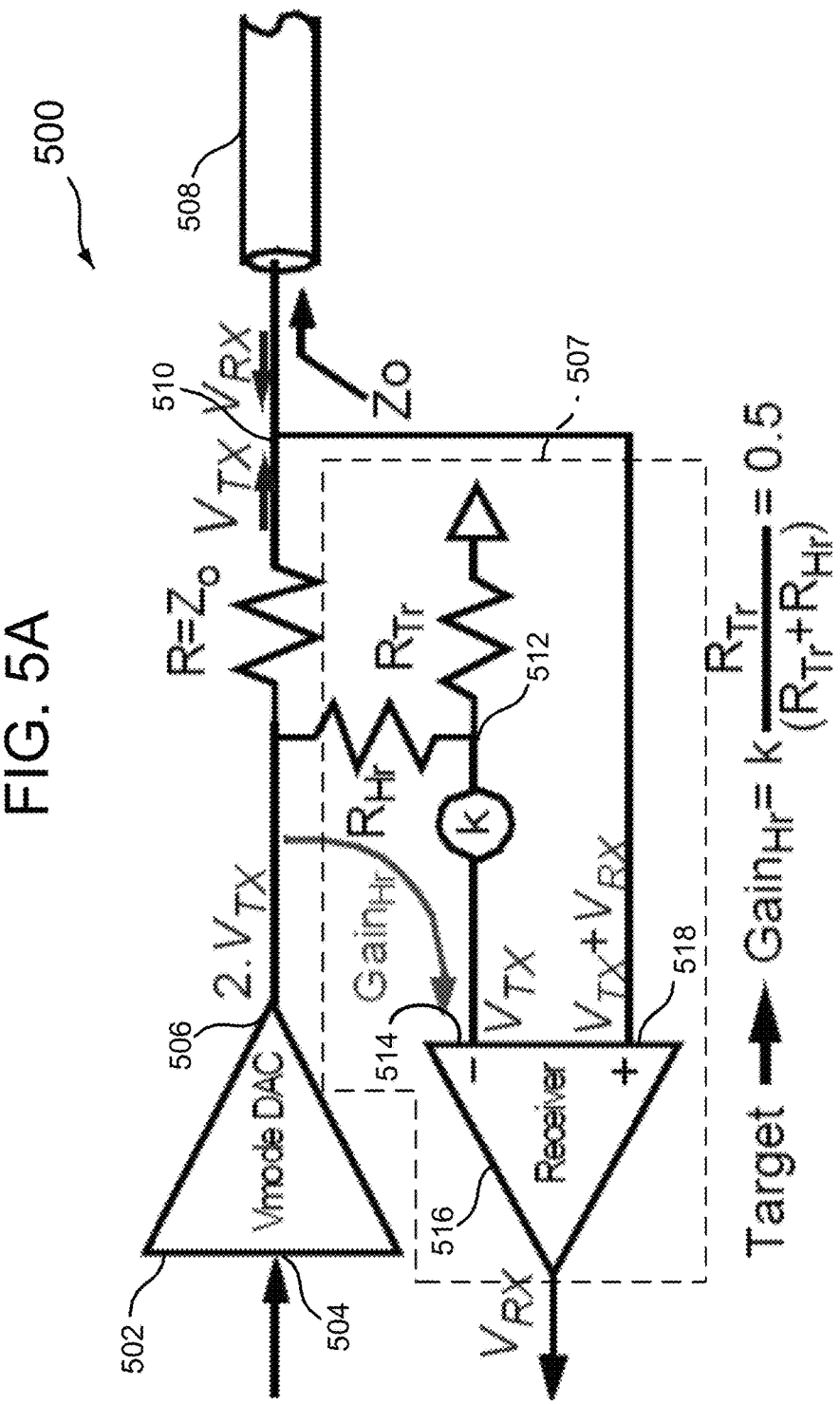
FIG. 5A illustrates one embodiment of a driver circuit for use with one or more of the MCM embodiments described in FIGS. 1-4 and 6.

For some embodiments, it may be desirable to limit power consumption by taking into consideration the optimal value of a termination impedance associated with each link driver. FIG. 5A illustrates one embodiment of a bi-directional signaling scheme for a driver circuit 500 using a voltage-mode driver. Depending on the choice of a characteristic impedance $R_O = Z_O$, the circuit may be configured to exhibit high impedance with low-power dissipation, or low-impedance with high power dissipation. For one embodiment, the driver circuit 500 includes a voltage mode digital-to-analog converter (DAC) 502 with a digital data input 504 and an analog output 506 that generates an output voltage $2*V_{TX}$. The driver output 506 couples to a transmission line 508, and includes a line impedance $R_o$ that substantially matches the characteristic impedance $Z_o$ of the transmission line.

Further referring to FIG. 5A, the output driver node 506 also couples to an impedance network, or hybrid circuit 507, that includes a hybrid impedance $R_{Hr}$ in series with a replica termination impedance $R_{Tr}$. The resulting voltage $V_{TX}$ at the node 512 connecting $R_{Hr}$ and $R_{Tr}$ is fed to a gain stage k, then to an input 514 of a receiver 516. For some embodiments, the gain stage k may include circuitry inside the receiver 516. Alternatively, instead of the gain stage k, a gain stage 1/k may be placed between receiver input 518 and line 510. A second input 518 of the receiver 516 couples to the transmission line 508 to receive a summed voltage of a receive data voltage $V_{RX}$ and the transmit data voltage $V_{TX}$. The common voltage components at the receiver cancel out, thus leaving a resulting receive voltage of $V_{RX}$.

With continued reference to FIG. 5A, for ultra-short reach (USR) links that have minimal or no attenuation due to channel high-frequency losses, the value of the line and termination resistance can be made larger than typical 100 ohm (differential) or 50 ohm (single-ended) characteristic impedances. A larger value for the termination impedance, while resulting in potential losses at higher frequencies, nevertheless enables additional power reduction. Moreover, the higher termination resistance means smaller current pulses for the same voltage amplitude, and thus smaller driver induced noise into the supply network.

Another method to reduce power further, in parallel with increasing the line & termination resistance as described above, is to minimize the power in the hybrid (transmit replica) path. The lowest power in the hybrid path may be realized by the relationship:

Hybrid topology $A) R_{Tr}$=Open circuit(infinite impedance) with "$k$"=0.5

In the above scenario, the transmit main path and hybrid path may not be the best match across frequency and thus the cancellation may not be optimal. On the other hand, the optimal hybrid cancellation across frequency may be realized by the following relationship:

Hybrid topology $B) R_{Hr} = R_{Tr} = Z_0$ with "$k$"=1.0

In many ultra-short reach applications (such as in MCM packages), the received signal-to-noise ratio (SNR) is high, such that a reduction in power can be carried out successfully using hybrid topology A as well as higher termination & line impedance without impacting the bit error rate.

Figure 5B:
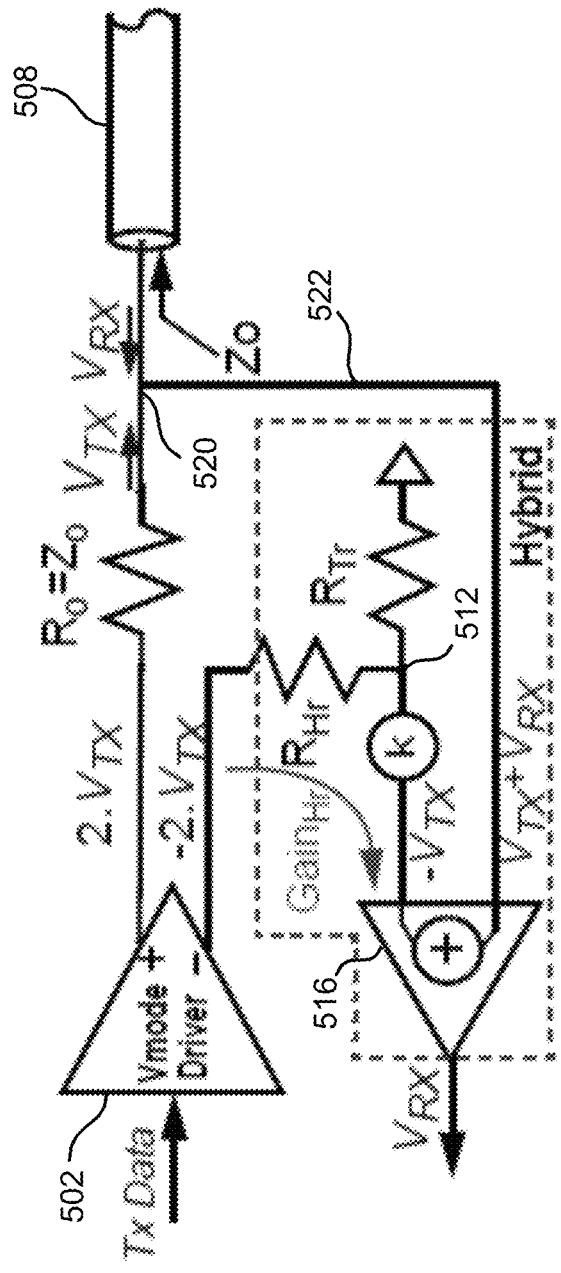
FIG. 5B illustrates the driver circuit of FIG. 5a with differential connections.

FIG. 5B illustrates the driver architecture of FIG. 5A in a differential context, where the driver 502 includes respective positive "+" and negative "−" outputs. Input transmit data Tx DATA is output by the positive and negative driver outputs. A positive voltage of, for example, $2*V_{TX}$ is output via the positive output across line resistance $R_O$. With $R_O$ matching the transmission line impedance $Z_O$, a voltage of $V_{TX}$ from the driver is exhibited at node 520, along with a voltage of $V_{RX}$ from a link partner driver received via transmission line 508. The summed voltage $V_{TX}+V_{RX}$ is then fed via path 522 to a positive input of receiver 516. The hybrid impedance $R_{Hr}$ is disposed in series with the replica termination impedance $R_{Tr}$, and coupled to a negative output of driver 502. The resulting voltage of $-V_{TX}$ (one-half the driver output due to the voltage divider) at the node 512 connecting $R_{Hr}$ and $R_{Tr}$ is fed to a gain stage k, then to the negative input of the receiver 516. At the receiver inputs, the common-mode voltage components from voltages $-V_{TX}$ and $V_{TX}+V_{RX}$ result in a received voltage of $V_{RX}$.

Figure 5C:
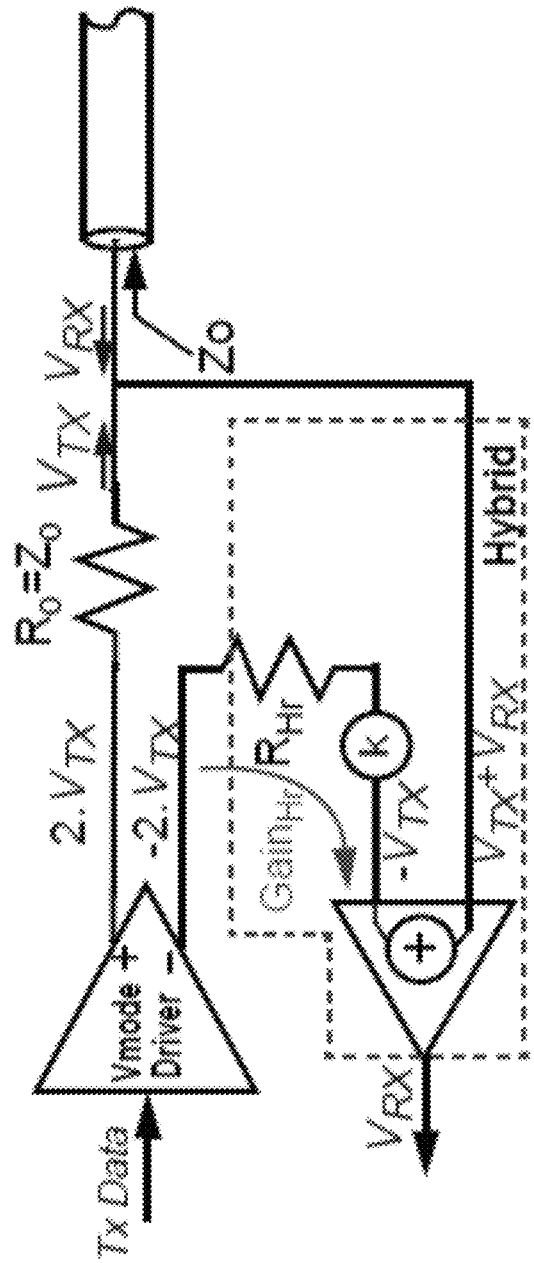
FIG. 5C illustrates the driver circuit of FIG. 5b with an infinite (or "open") termination resistance $R_{Tr}$.

FIG. 5C illustrates the driver architecture of FIG. 5B, and corresponds to the above-described "Hybrid Topology A", with the termination impedance $R_{Tr}$ (not shown) set to a large value (such as one approximating infinity), or an open (floating) termination. Such a topology exhibits significantly lower power dissipation characteristics.

Figure 5D:
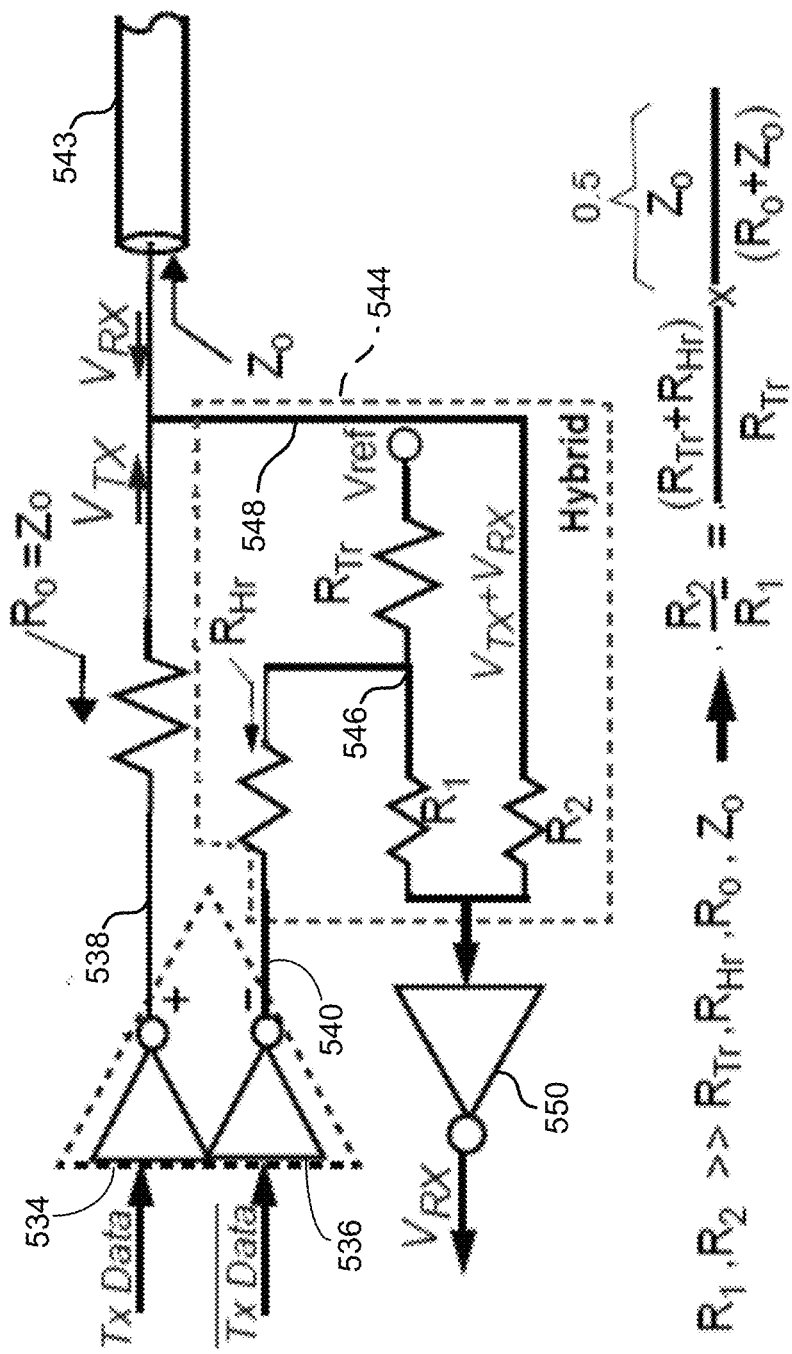
FIG. 5D illustrates the driver circuit of FIG. 5a in a differential context and utilizing straightforward inverters.

FIG. 5D illustrates a similar driver architecture to those described above, but utilizes simplified components such as inverters, resistors and switches that are readily available in standardized digital design flows. Minimizing the use of analog circuit elements significantly reduces chip design cost.

Further referring to FIG. 5D, the architecture includes differential transmitter circuitry 532 that employs a pair of inverters 534 and 536. The inverters drive transmit data Tx DATA and complement data $\overline{TxDATA}$ along respective transmit and replica paths 538 and 540.

With continued reference to FIG. 5D, the transmit path 538 is coupled to a transmission line 543 and includes an impedance $R_O$ tuned to substantially match a characteristic impedance $Z_O$ of the transmission line. The replica path 540 incorporates a hybrid circuit 544. The hybrid circuit includes a hybrid resistance $R_{Hr}$ that cooperates with a termination resistance $R_{Tr}$ to form a voltage divider at node 546. One end of the termination resistance $R_{Tr}$ is tied to a reference voltage $V_{REF}$, such as ground, although any reference voltage may be used, such as $V_{DD}/2$.

Further referring to FIG. 5D, the hybrid circuit 544 includes a summing network of resistors R1 and R2 that are disposed in parallel, with one end of resistor R1 coupled to the voltage divider node 546, and the other end tied to resistor R2. Resistor R2 has one end tied to the transmission line 543 to form a receive data path 548. The summing network results in a replica transmit data voltage being subtracted from a superposed transmit and receive data voltage that is fed from the transmission line 543 along the receive data path 548. The summed voltage may then be fed to an input of an inverter receiver 550.

The transceiver architecture of FIG. 5D essentially corresponds to the driver architecture of FIG. 5A, and implements straightforward inverters, resistors and switches that work well in a digital design flow, without the need for separate analog design flow processes that may increase cost. The receiver 550, realized as a straightforward inverter, is relieved of an analog comparator function since the summing resistor network of R1 and R2 cancel out the superposed transmit voltage from the receiver voltage. Further, power and hybrid cancellation parameters may be optimized, depending on the application. For example, increasing the value of the termination resistance $R_{Tr}$ results in lower power dissipation, while optimum hybrid cancellation across frequency may be realized by substantially matching the value of $R_{Tr}$ to $R_{Hr}$. For low-power optimizations, the termination resistor $R_{Tr}$ may be set to a very high value, or left open or in a floating configuration. This architecture is also consistent with the lowest-power optimization to the transceiver of FIG. 5C, with the termination resistance set to an infinite value, or open-circuit.

Figure 6:
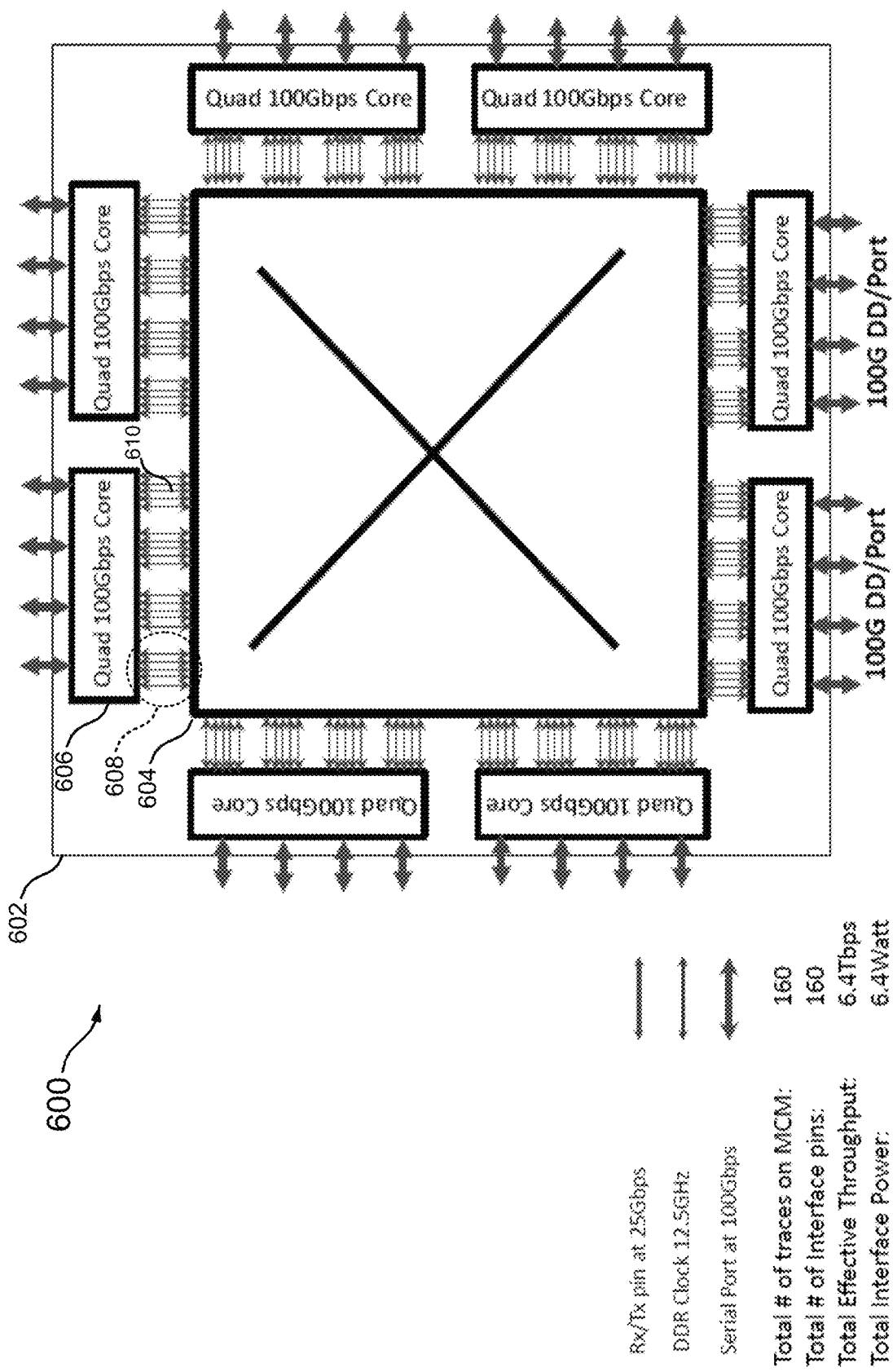
FIG. 6 illustrates an N-Tbps Switch ASIC with SerDes cores disposed on a common multi-chip module.

FIG. 6 illustrates a further embodiment of a multi-chip module (MCM), generally designated 600. The MCM includes a substrate 602 that mounts an application specific integrated circuit (ASIC) 604 that, for one embodiment, is fabricated and programmed to carry out the function of a network switch capable of handling data traffic at N-Tbps data rates. The MCM 600 includes multiple IC chips in the form of serializer-deserializer (SerDes) cores 606 disposed on the substrate 602. For one specific embodiment, each SerDes core 606 couples to the ASIC 604 via source-synchronous bidirectional interfaces that employ multiple groups 608 of serial links in the form of input/output (I/O) circuits. In one embodiment, each I/O transmits and receives up to approximately 28 Gbps (NRZ data) or approximately 56 Gbps (PAM4 data). Each group of links (such as four differential data links) is associated with a source-synchronous DDR clock link, such as at 610, capable of running at, for example, 14 GHz. For some embodiments, the clock signals transferred along the clock lines may be sourced from the SerDes cores 606 (acting as a master IC chip for timing synchronization purposes) and passed to the ASIC 604 (acting as a slave IC chip for timing synchronization purposes) to receive and transmit data. For such embodiments, the phase alignment circuit, such as the clock vernier 216 (FIG. 2), may also be employed for optimal receiver sampling in the SerDes cores. In other embodiments, however, the clock vernier may be eliminated by employing a bidirectional clocking architecture such that both sides receive the clock whose phase is aligned with the receive data phase.

In some embodiments, the trace lengths between the SerDes cores 606 and the ASIC 604 (less than 1 inch) may be configured to provide proper round trip phase relationship between receive and transmit data for any symbol time. For one embodiment, respective phase alignments between transmit and receive data may be optimally offset such that signal transitions are non-aligned, resulting in a more optimal eye opening for receiver sampling purposes. One embodiment for a circuit to carry this out is disclosed in application Ser. 62/317,493, titled "Dual-Duplex Link With Independent Transmit and Receive Phase Adjustment", filed Apr. 1, 2016, assigned to the assignee of the instant application, and incorporated by reference in its entirety.

With continued reference to FIG. 6, each link in the groups of links making up the interface may include driver circuits at each end, similar to the driver circuit described with respect to FIG. 5. For one specific embodiment, each pin includes a driver and hybrid circuit with a receiver sampler (three samplers if PAM 4 is utilized), a clock vernier (only for very high baud rates, such as greater than 10GBaud), serial-to-parallel conversion circuits, and an elastic buffer in the ASIC to synchronize data to the SerDes clock domain and vice versa. For some embodiments, the termination impedance may be optimized along with the baud rate and signal and power integrity requirements to achieve approximately 1 mW/Gbps or less. For embodiments that may utilize PAM4 symbols, relatively straightforward equalization such as transmit pre-emphasis may be employed as a design tradeoff for adjusting the termination impedance to higher values.

The MCM 600 of FIG. 6 provides minimal overhead and complexity while simultaneously providing very high data rates for a network switch environment. The source-synchronous clocks eliminate the need for ultra low-jitter clock generation phase-locked loops (PLL), as well as complex clock and data recovery (CDR) circuits. In the master side, such as the SerDes chips in FIG. 6, a relaxed clock generation source as well as a simple phase alignment circuitry instead of a complex CDR can deliver the required performance. On the slave side, such as the ASIC chip in FIG. 6, all analog circuitries such as a clock source, and a phase alignment block can be completely eliminated. Further, the short traces eliminate the need for complex equalization.

For some embodiments, the transceivers described above may be configurable for a variety of signaling modes. The descriptions set forth above set out an operating mode for each transceiver circuit to carry out simultaneous bidirectional signaling across a serial link or lane (duplex signaling), where a pair of such lanes amount to a dual-duplex mode of operation. For some situations, however, a legacy serial link interface may form one end of a given serial link. Such legacy SerDes transceivers typically operate in a single duplex mode, where a given lane is dedicated to transmission of data or reception of data. Bidirectional data transfers are thus carried across two separate lanes for typical single duplex SerDes transceivers. Employing different serial interfaces on a given integrated circuit chip to support multiple signaling schemes can be complex, inefficient, and costly. The multi-mode serial link transceiver architecture described below addresses those problems by enabling a pair of simultaneous bidirectional transceivers, as described above, to be configured in one mode as a dual-duplex interface, or configured in a second mode to operate consistent with standard SerDes single duplex links.

Figure 7:
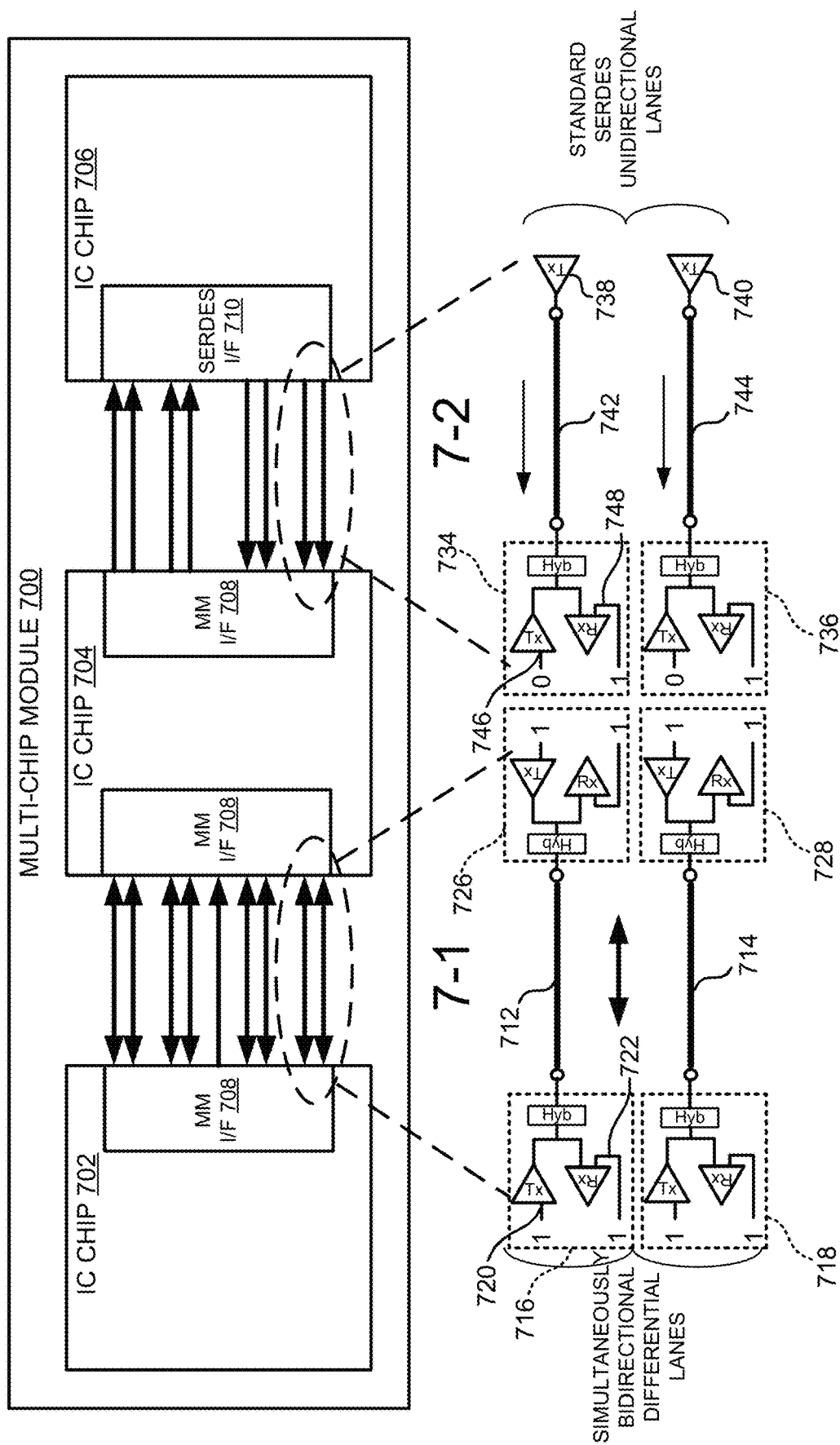
FIG. 7 illustrates a multi-chip module that employs dual-duplex transceiver circuits similar to those shown in FIG. 5, with a multiple-mode capability.

FIG. 7 illustrates a multi-chip module 700 that mounts multiple integrated circuit (IC) chips 702, 704 and 706. IC chip 702 includes a first multi-mode signaling interface 708 configured as a dual-duplex signaling interface. IC chip 704 also includes a multi-mode interface 710 to communicate with the multi-mode interface 708 of IC chip 702.

View 7-1 illustrates respective transceiver circuits 716, 718, 726 and 728 that are disposed at each end of a pair of lanes 712 and 714, and the control circuitry used to configure them. For IC chip 702, the first and second transceivers 716 and 718 each include a driver Tx and a receiver Rx. Each driver and receiver may be enabled in response to a control signal received at respective control inputs 720 and 722. Enabling both the driver Tx and receiver Rx results in a transceiver capable of simultaneous bidirectional signaling. By repeating this configuration with the link partner transceiver, at 726, and the second link transceivers, at 718 and 728, a dual-duplex mode of operation is realized.

Further referring to FIG. 7, IC chip 704 also communicates with IC chip 706 via a second interface 730 to communicate with a standard Serdes interface 732 of IC chip 706. To avoid implementing a different interface design corresponding to a standard SerDes interface into IC chip 704, the interface 730 employs the configurable multi-mode features similar to those described above. This enables a consistent single-interface design to be utilized throughout the chip, resulting in design efficiencies and lower costs.

View 7-2 illustrates respective transceiver circuits 734, 736, 738 and 740 that are disposed at each end of a pair of lanes 742 and 744, and the control circuitry used to configure them. For IC chip 704, transceivers 734 and 736 each include a driver Tx and a receiver Rx similar to that discussed above. Each driver and receiver may be separately enabled/disabled in response to a control signal received at respective control inputs, such as at 746 and 748. Disabling the driver Tx with a logic "0" control signal and enabling the receiver Rx with a logic "1" control signal results in a transceiver dedicated to receiving data (from the perspective of IC chip 704). At the link partner, only the transmitter Tx 738 is enabled, while the receiver (not shown) is disabled. By repeating this configuration with the second link transceivers 736 and 740, half of a single-duplex mode of operation is realized. The other half of the duplex configuration would be for a second set of links to be configured that are dedicated only to transmitting data (from the perspective of IC chip 704).

Figure 8A:
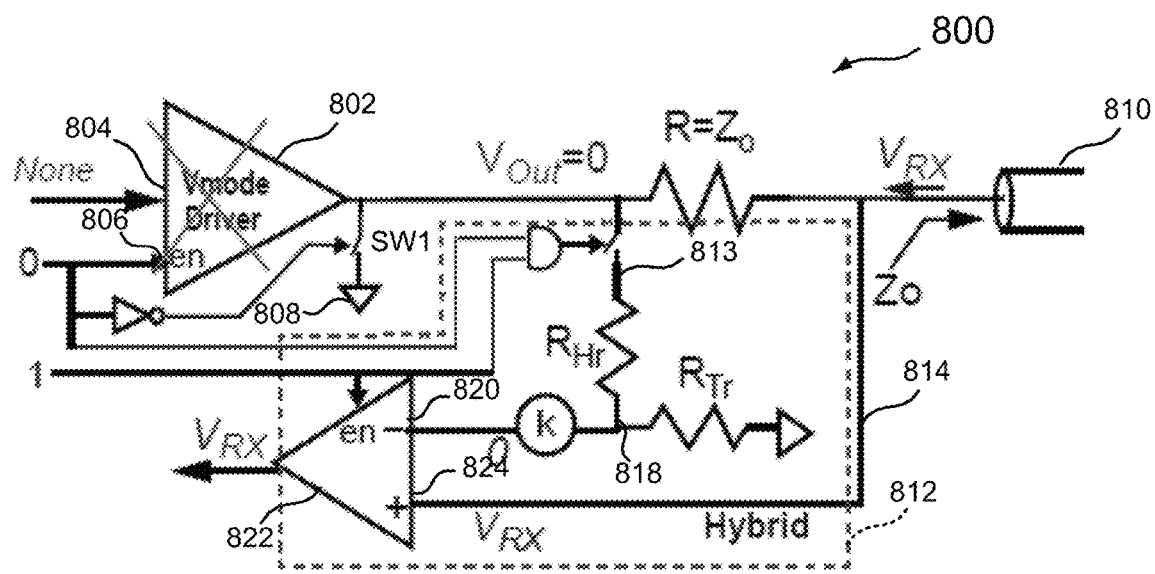
FIG. 8A illustrates a transceiver circuit of FIG. 7 in a single-duplex receive mode.
Figure 8B:
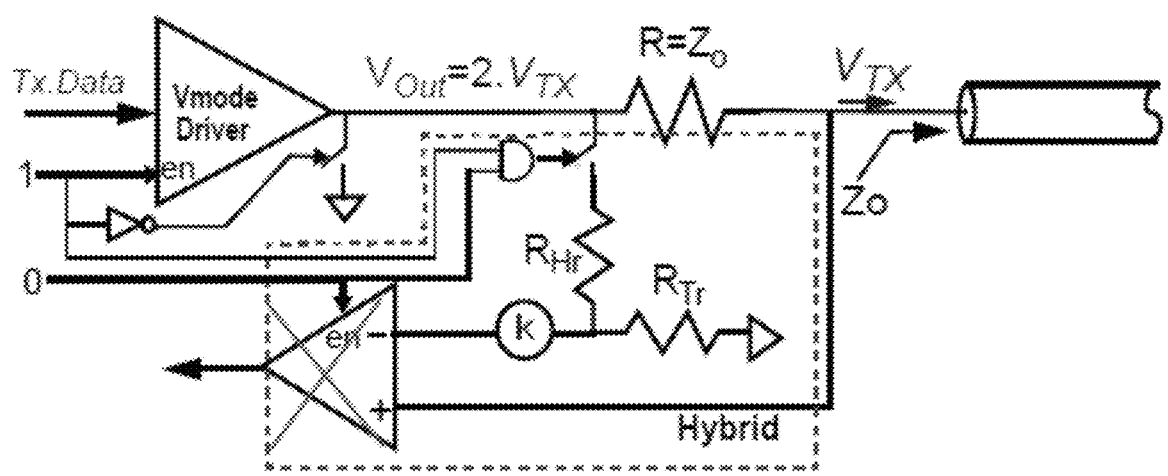
FIG. 8B illustrates a transceiver circuit of FIG. 7 in a single-duplex transmit mode.

FIGS. 8A and 8B illustrate further detail for respective receive-only (FIG. 8A) and transmit only (FIG. 8B) enabled transceivers such as those shown in FIG. 7, and including hybrid circuit elements, such as those shown in FIGS. 5A-5D, that are selectively enabled based on the multi-mode configurations. The structure of FIG. 8A will be described in detail, with the understanding that the structure of FIG. 8B is similar, but configured in a receive-only mode. To reiterate, transceivers that are configured to operate in a dual-duplex configuration will have both receivers and transmitters enabled, while transceivers for single-duplex operation will have only receiver circuitry enabled (such as that shown in FIG. 8A), or transmit circuitry enabled (as in FIG. 8B).

Referring again to FIG. 8A, for one embodiment, each transceiver 800 includes a voltage mode driver 802 having a data input, at 804, and a control input to receive a configuration signal, at 806. The configuration signal is also fed to a switch SW1 that opens/closes an output shorting path leading to a voltage reference, such as ground, at 808.

The output of the driver 802 is fed across an impedance $R_O$ that is sized to correspond to a characteristic impedance $Z_O$ of a signaling channel or transmission line 810. Note that for the configuration of FIG. 8A, the received configuration signal results in the driver 802 being disabled.

Further referring to FIG. 8A, the transceiver 800 includes a hybrid circuit 812 that includes a transmit replica path 813 and a receive data path 814. The transmit replica path 813 includes a hybrid impedance $R_{Hr}$ in series with a replica termination impedance $R_{Tr}$. The resulting voltage $V_{TX}$ at node 818 connecting $R_{Hr}$ and $R_{Tr}$ is fed to a gain stage k, then to an input 820 of a receiver 822. For some embodiments, the gain stage k may include circuitry inside the receiver 822. Alternatively, instead of the gain stage k, a gain stage 1/k may be placed between receiver input 820 and node 818. A second input 824 of the receiver 822 couples to the transmission line 810 via the receive data path 814 to receive a summed voltage of a receive data voltage $V_{RX}$ and the transmit data voltage $V_{TX}$. The common voltage components at the receiver cancel out, thus leaving a resulting receive voltage of $V_{RX}$. Note that with the transceiver 800 configured in a receive-only mode, there will be no $V_{TX}$ component, still resulting in a receive voltage of $V_{RX}$.

Figure 9:
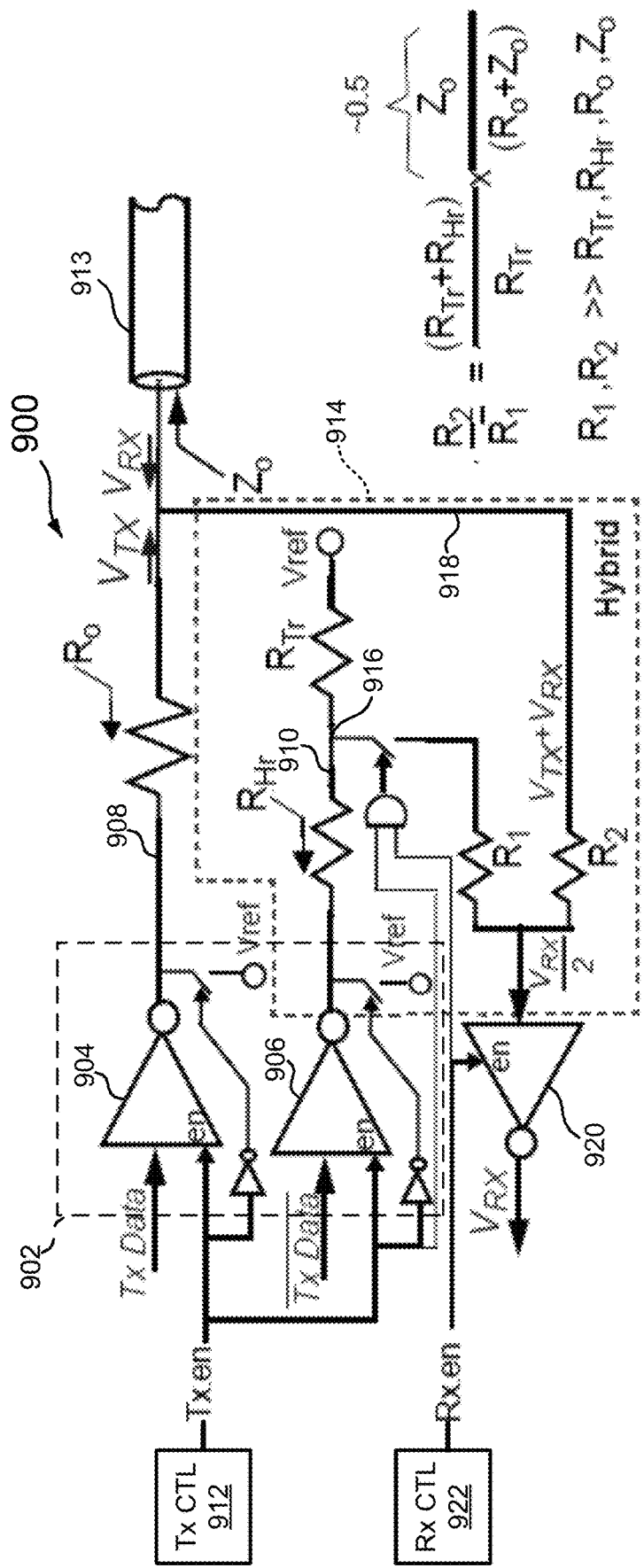
FIG. 9 illustrates a multi-mode transceiver embodiment similar to that shown in FIGS. 8A and 8B.

FIG. 9 illustrates a further embodiment of a transceiver, generally designated 900. The transceiver 900 is similar to that described above in FIG. 5D, exhibiting a simplified architecture that utilizes straightforward inverters, resistors and switches that are readily available in standardized digital design flows. Chip design costs may thus be minimized by avoiding analog components in the design.

Further referring to FIG. 9, the transceiver 900 includes differential transmitter circuitry 902 that employs a pair of inverters 904 and 906. The inverters drive transmit data Tx DATA and complement data $\overline{\text{TxDATA}}$ along respective transmit and replica paths 908 and 910. Transmit control circuitry 912 distributes a transmit control signal Tx.en to enable/disable the transmitter circuitry, depending on the desired configurable mode of operation.

With continued reference to FIG. 9, the transmit path 908 is coupled to a transmission line 913 and includes an impedance $R_O$ tuned to substantially match a characteristic impedance $Z_O$ of the transmission line. The replica path 910 incorporates a hybrid circuit 914. The hybrid circuit includes a hybrid resistance $R_{Hr}$ that cooperates with a termination resistance $R_{Tr}$ to form a voltage divider at node 916. One end of the termination resistance $R_{Tr}$ is tied to a reference voltage, such as ground, although any reference voltage may be used, such as $V_{DD}/2$.

Further referring to FIG. 9, a summing network of resistors R1 and R2 are disposed in parallel, with one end of resistor R1 coupled to the voltage divider node 916, and the other end tied to resistor R2. Resistor R2 has one end tied to the transmission line to form a receive data path 918. The summing network results in a replica transmit data voltage being subtracted from a superposed transmit and receive data voltage that is fed from the transmission line 913 along the receive data path 918. The summed voltage may then be fed to an input of an inverter receiver 920. Receiver control circuitry 922 distributes a receiver control signal Rx.en to enable/disable the receiver circuitry depending on the desired configurable mode of operation.

The transceiver architecture of FIG. 9 implements straightforward inverters, resistors and switches that work well in a digital design flow, without the need for separate analog design flow processes that may increase cost. The receiver 920, realized as a straightforward inverter, is relieved of an analog comparator function since the summing resistor network of R1 and R2 cancel out the superposed transmit voltage from the receiver voltage. Further, power and hybrid cancellation parameters may be optimized, depending on the application. For example, increasing the value of the termination resistance $R_{Tr}$ results in lower power dissipation, while optimum hybrid cancellation across frequency may be realized by substantially matching the value of $R_{Tr}$ to $R_{Hr}$.

Figure 10:
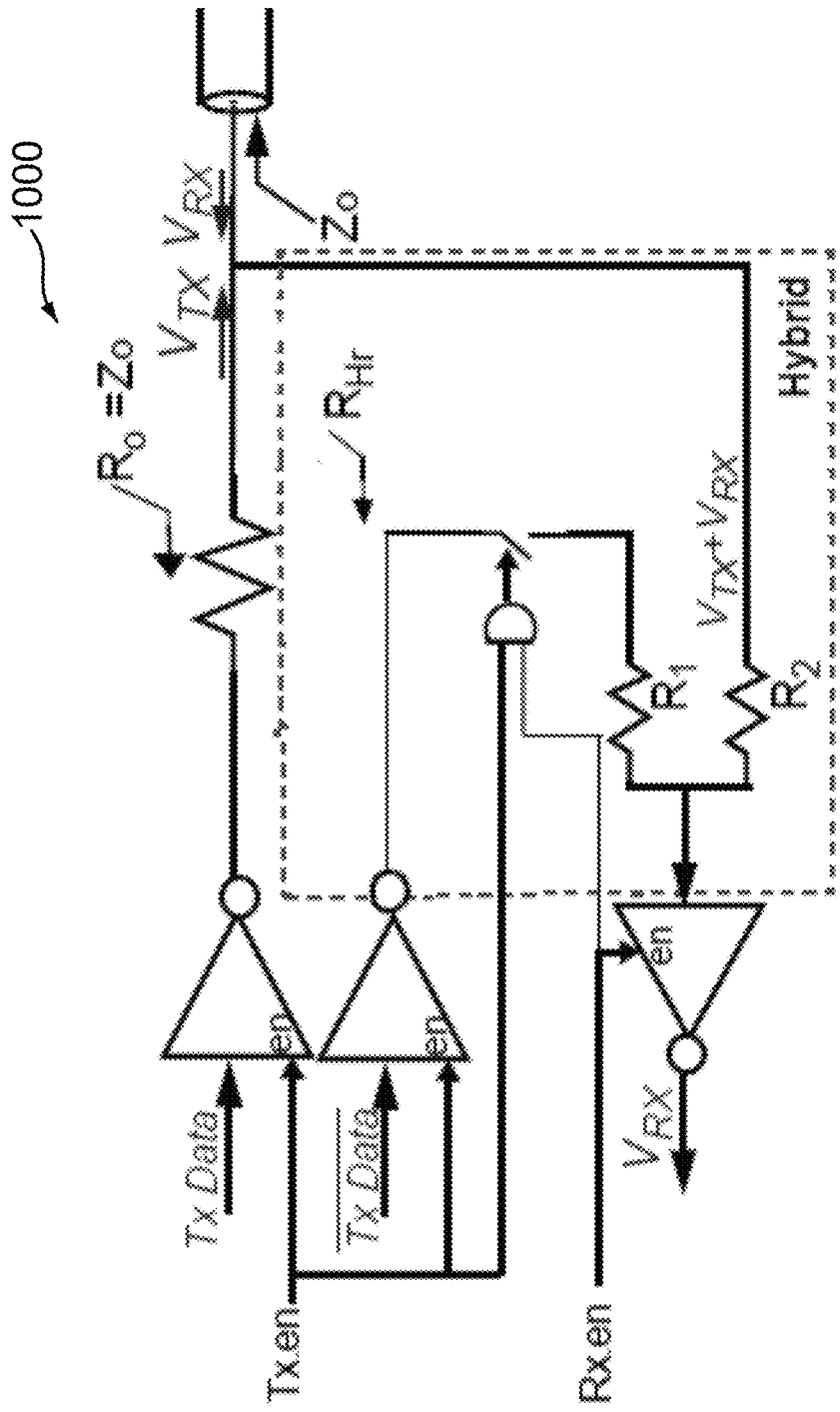
FIG. 10 illustrates a multi-mode transceiver embodiment similar to that shown in FIG. 9.

FIG. 10 illustrates a further embodiment of a transceiver, generally designated 1000, without a termination resistor $R_{Tr}$ (or set to a very high value) to realize a floating configuration. This architecture is consistent with the lowest-power optimization to the transceiver of FIG. 9, with the termination resistance set to an infinite value, or open-circuit.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A multi-chip module (MCM), comprising:
a substrate;
a first integrated circuit disposed on the substrate; and
a second integrated circuit disposed on the substrate, the second integrated circuit including transceiver circuitry configured to communicate with the first integrated circuit, the transceiver circuitry comprising
transmit circuitry configured to transmit a first signal to the first integrated circuit via a signaling link, and
receiver circuitry configured i) to receive the first signal and a second signal superposed on each other, the second signal being received from the first integrated circuit at the second integrated circuit via the signaling link concurrently with transmission of the first signal by the transmit circuitry via the signaling link, and ii) to cancel the first signal from the superposed first signal and second signal to provide the second signal.

2. The MCM of claim 1, wherein the receiver circuitry comprises an impedance that is greater than a line termination impedance of the signaling link.

3. The MCM of claim 1, wherein:
the transmit circuitry comprises a differential driver circuit comprising a first inverter and a second inverter;
the first inverter is configured to transmit the first signal;
the second inverter is configured to transmit a complement of the first signal; and
the receiver circuitry is configured to receive the complement of the first signal concurrently with the first signal and the second signal.

4. The MCM of claim 3, wherein the receiver circuitry comprises:
a receiver;
a first receive path coupled between the signaling link and a first input of the receiver to feed the second signal from the first integrated circuit to the receiver; and a second receive path coupled between the differential driver circuit and the first input or a second input of the receiver.

5. The MCM of claim 4, wherein the receiver is an inverter coupled to the first receive path and the second receive path.

6. The MCM of claim 4, wherein the second receive path comprises a voltage divider, the voltage divider comprising a first impedance and a second impedance.

7. The MCM of claim 6, wherein the second impedance is greater than the first impedance.

8. A chiplet comprising:
transmit circuitry configured to generate a first signal for transmission from the chiplet via a signaling link; and
receiver circuitry configured i) to receive the first signal and a second signal superposed on each other, the second signal being received from the signaling link at the chiplet concurrently with transmission of the first signal by the transmit circuitry via the signaling link, and ii) to cancel the first signal from the superposed first signal and second signal to provide the second signal.

9. The chiplet of claim 8, wherein the receiver circuitry comprises an impedance that is greater than a line termination impedance of the signaling link.

10. The chiplet of claim 8, wherein the transmit circuitry comprises a differential driver circuit comprising:
a first inverter configured to transmit the first signal; and
a second inverter configured to transmit a complement of the first signal.

11. The chiplet of claim 10, wherein the receiver circuitry further comprises:
a receiver;
a first receive path coupled between the signaling link and a first input of the receiver circuitry to feed the second signal from the signaling link to the receiver; and
a second receive path coupled between the differential driver circuit and the first input or a second input of the receiver.

12. The chiplet of claim 11, wherein the receiver is an inverter coupled to the first receive path and the second receive path.

13. The chiplet of claim 11, wherein the second receive path comprises a voltage divider, the voltage divider comprising a first impedance and a second impedance.

14. The chiplet of claim 13, wherein the second impedance is greater than the first impedance.

15. A multi-chip module (MCM) comprising:
a substrate;
a bidirectional signaling link disposed on the substrate;
a first integrated circuit disposed on the substrate, the first integrated circuit including a first receiver circuit coupled to a first end of the bidirectional signaling link; and
a second integrated circuit disposed on the substrate, the second integrated circuit including a second receiver circuit coupled to a second end of the bidirectional signaling link,
wherein
the first integrated circuit is configured to transmit a first signal to the second integrated circuit over the bidirectional signaling link concurrently with the second integrated circuit transmitting a second signal to the first integrated circuit over the bidirectional signaling link,
the first receiver circuit and the second receiver circuit are each configured to receive i) the first signal transmitted from the first integrated circuit to the second integrated circuit, and ii) the second signal transmitted from the second integrated circuit to the first integrated circuit,
the first receiver circuit is configured to cancel the first signal to output the second signal, and
the second receiver circuit is configured to cancel the second signal to output the first signal.

16. The MCM of claim 15, wherein:
the first receiver circuit comprises an impedance that is greater than a line termination impedance of the bidirectional signaling link; and
the second receiver circuit comprises an impedance that is greater than the line termination impedance.

17. The MCM of claim 1, wherein the receiver circuitry comprises a first impedance connected in series between a first output of the transmit circuitry and a first input of a receiver of the receiver circuitry, the first impedance receiving a complement of the first signal.

18. The MCM of claim 17, further comprising a second impedance connected in series with the first impedance between the first output of the transmit circuitry and the first input of the receiver.

19. The MCM of claim 17, wherein the transmit circuitry comprises a second output separate from the first output and configured to transmit the first signal.

20. The MCM of claim 17, wherein the receiver circuitry comprises a voltage divider comprising the first impedance and a second impedance, the second impedance is connected in series with the first impedance and a reference terminal.

21. The MCM of claim 17, wherein the receiver circuitry is absent an impedance connected between the first impedance and a reference terminal.

22. The MCM of claim 20, further comprising a gain stage connected in series with the first impedance between the first output of the transmit circuitry and the first input of the receiver.

23. The MCM of claim 20, wherein the second impedance is greater than the first impedance.

24. The MCM of claim 23, further comprising a third impedance connected in series with the first impedance between the first output of the transmit circuitry and the first input of the receiver.

25. The MCM of claim 24, further comprising a fourth impedance connected to a second input of the receiver and to receive the first signal and the second signal.

* * * * *